United States Patent [19]

Shiraki et al.

[11] Patent Number: 4,673,959

[45] Date of Patent: Jun. 16, 1987

[54] HETEROJUNCTION FET WITH DOUBLY-DOPED CHANNEL

[75] Inventors: Yasuhiro Shiraki, Hino; Yoshifumi Katayama, Tokorozawa; Yoshimasa Murayama, Koganei; Makoto Morioka, Nishitama; Yasushi Sawada, Kokubunji; Tomoyoshi Mishima, Shiki; Takao Kuroda, Kokubunji; Eiichi Maruyama, Kodaira, all of Japan

[73] Assignee: Hitachi, Ltd., Tokyo, Japan

[21] Appl. No.: 686,661

[22] Filed: Dec. 27, 1984

[30] Foreign Application Priority Data

Dec. 28, 1983 [JP] Japan ................... 58-246273

[51] Int. Cl.⁴ ........................................... H01L 29/80
[52] U.S. Cl. ........................................ 357/22; 357/16; 357/58
[58] Field of Search ................. 357/22 MD, 22 A, 16, 357/58

[56] References Cited

U.S. PATENT DOCUMENTS 4,194,935 3/1980 Dingle et al. ................ 357/22 MD
4,503,600 3/1985 Nii et al. ...................... 357/22 A

FOREIGN PATENT DOCUMENTS

0064370(A2) 11/1982 European Pat. Off. ....... 357/22 MD

OTHER PUBLICATIONS

Hiyamizu et al, "MBE-Grown GaAs/N-AlGaAs Heterostructures and their Application to High Mobility Transistors", Jap. Jour. of Appl. Physics, vol. 21, 1982, Supplement 21-1, pp. 161-168.

Thurne et al, "Performance of Inverted Structure Modulation Doped Schottky Barrier Field Effect Transistors", Jap. Jour. of Appl. Physics, vol. 21, No. 4, Apr. 1982, pp. 1223-1224.

Primary Examiner—Andrew J. James
Assistant Examiner—William A. Mintel
Attorney, Agent, or Firm—Antonelli, Terry & Wands

[57] ABSTRACT

There is disclosed a semiconductor device comprising at least first and second semiconductor layers positioned to form a hetero-junction therebetween, such a hetero-junction being adapted to form a channel, means for controlling carriers, and source and drain areas on opposite edges of the channel, wherein the first and second semiconductor layers formed between the source and drain regions have an area containing only $10^{16} cm^{-3}$ or less of an impurity; the first semiconductor layer has a wider forbidden band than that of the second semiconductor layer; and further including at least one semiconductor layer having a higher activation efficiency of impurities than that of the first semiconductor layer, with such at least one semiconductor layer being located on the side of the first semiconductor layer not in contact with the second semiconductor layer. A multi-quantum well structure may be used as the higher impurity activation efficiency semiconductor layer. The electrical resistance in the semiconductor area constituting the source and drain regions can be lowered by utilizing such a higher impurity activation efficiency semiconductor layer.

15 Claims, 12 Drawing Figures

HETEROJUNCTION FET WITH DOUBLY-DOPED CHANNEL

BACKGROUND OF THE INVENTION

1. Field of the Invention

This invention relates to a semiconductor device using carriers derived from a semiconductor heterostructure interface.

2. Description of the Prior Art

Gallium arsenide (GaAs), having a much higher mobility of electrons than silicon, is suitable for producing a fast device. However, production of an MOS (Metal-Oxide-Semiconductor) type of field effect transistor using GaAs, similar to that using silicon was impossible, because of the difficulty in the formation of a good insulator when using GaAs. Recently, it has been found that the employment of a hetero-structure of GaAs and aluminum gallium arsenide (AlGaAs) containing donor impurities can provide a field effect transistor owing to the generation of carriers at the interface. FIG. 1 shows the drawing of band structure of the above-mentioned transistor's working area wherein 13 is an electrode portion, 12 an AlGaAs layer containing an impurity, and 11 a GaAs layer containing substantially no impurity. Fe indicates Fermi level. In FIG. 1, 15 indicates the carriers confined in the triangular potential well. Since the carriers 15 which are provided from the donor impurity (14) in AlGaAs (12) transit through GaAs containing no impurities, they are separately placed from the ionized donor impurity. As a result, the scattering of electrons due to the impurity potential can be greatly reduced and high mobility can be achieved. However, in transistors of such structure with high mobility electrons, the transconductance becomes small because the gate voltage is not effectively applied to the interface due to the larger addition of donor impurity. In order to avoid this effect, it is desirable to use AlGaAs containing no impurities as in the MOS structure. However, in the case of a Schottky type gate, there are gaps between the source and drain electrodes and the channel, which differs from the MOS structure. Accordingly, when no donor impurity is added, no carriers are induced in this gap portion, so that the channel and the source-drain electrodes cannot be connected to work as a transistor.

It is to be noted that the above examples are given in Japanese Journal of Applied Physics Vol. 19, No. 5, May, 1980, pp L225–L227 and MICROWAVES, October, 1980, p. 20.

There is proposed a field effect transistor characterized by introducing donor impurities into the gate electrode-side semiconductor having the wide forbidden band in the gap area between the channel and the source-drain electrodes, such as AlGaAs in the above-mentioned example, and by introducing no impurity in the channel portion directly under the gate electrode. FIG. 2 shows the band diagram in the working area of the above-mentioned field effect transistor, wherein 13 is an electrode portion, 12 an AlGaAs layer, 11 a GaAs layer and $F_E$ Fermi level, similar to FIG. 1. Such structure has the following characteristic features.

(1) Mobility increases because there are no impurities in AlGaAs near the channel which act as scattering centers.

(2) Mutual conductance can be increased by effectively applying a gate voltage to the channel portion because the AlGaAs layer can have the same effect as the insulating layer in the MOS structure.

(3) The channel portion and the source-drain electrodes can be connected to work as a transistor by introducing donor impurities in the gap area between the channel and electrodes.

However, in the case of the above-mentioned transistor, the source-drain electrodes are generally formed by ion implantation. In this case, when the composition ratio of Al in AlGaAs is at least 0.25, the activation efficiency of the introduced impurities is not high, so that the resistance in the electrode portions becomes higher, to exert a harmful influence on speeding up the movement of electrons.

SUMMARY OF THE INVENTION

This invention relates to an improvement of the latter semiconductor device described above. Namely, this invention is directed to an improvement of the semiconductor device which is comprised by forming a heterostructure having a hetero-junction between the first and the second semiconductor layers containing substantially no impurities, and by using the potential formed at the interface as the channel.

This invention can effectively lower the resistance of the semiconductor areas to constitute the means of transmitting and receiving carriers (the source and drain areas) to bring about the fast operation of the semiconductor device.

The fundamental idea of this invention is shown as follows.

The semiconductor area constituting the means of transmitting and receiving carriers at both end portions of the channel (the source and drain areas) usually consist of the first and the second semiconductor layers which form the hetero-junction to constitute the channel. Either one of the first and the second semiconductor layers consists of the semiconductor material having the wide forbidden band, which operates as the so-called barrier layer. In this invention, at least one semiconductor layer, having a good activation efficiency of impurities, is inserted into another surface side opposite to the surface constituting the channel of said barrier layer before the introduction of impurities, so that these semiconductor layers produce the hetero-junction structure. Usually the narrower forbidden band of the semiconductor layer shows the higher activation efficiency of impurities. The first impurity area consists of the source-drain areas including the resulting laminated layer area. This first impurity area is usually formed by a method of implanting ions. The implantation energy and dose are determined as the impurity concentration in a volume concentration in the range from $5 \times 10^7$ to $5 \times 10^{19}$ cm$^{-3}$.

Moreover, the source and drain electrodes are usually formed in the first impurity area by alloying. It is a matter of course that these electrodes can be non-alloy types of electrodes by using the epitaxial layer containing a highly-concentrated impurity without employing the alloying method. In this case, the impurity concentration is approximately $5 \times 10^{18}$ cm$^{-3}$.

In said insular first impurity area, the presence of the semiconductor layer having a high activation efficiency of impurity brings about the connection to the channel, generates carriers suitable for the hetero-junction area extending into the first impurity area, and substantially lowers the resistance of the impurity area. Accordingly, the connection to the source and drain electrodes becomes quite good.

Further, the semiconductor layer area existing between the source and drain areas can have an area containing only $10^{16}$ cm$^{-3}$ or less of impurity without damaging the advantages of the claimed semiconductor device of this invention.

As to said semiconductor layer having a high activation efficiency of impurities, there may be used plural layers thereof. Alternatively, these layers may be comprised of the wider forbidden band layer and the more narrow forbidden band layer laminated one after the other, the so-called multi-quantum well. In this case, the thickness of the layer may be in a range from 10 to 100 Å, and that of the whole may be from 300 to 1000 Å. The multi-quantum well may be prepared by the well-known method.

It is to be noted that the semiconductor layer having a good activation efficiency of impurities is preferably placed near the channel. In most cases, the distance is favorably 500 Å or less, preferably 300 Å or less. The distance between the semiconductor layer having a good activation efficiency of impurities and the channel, and the concentration of an impurity included in the first insular impurity area, are determined according to the characteristic features required for a semiconductor device.

When the semiconductor layer having a good activation efficiency of an impurity is inserted into the electric current passage existing between the channel and the outer take-out area of source and drain electrodes (electrode metal or high-concentration impurity layer), or when said semiconductor layer is inserted between the channel and said outer take-out area of electrodes, the direct effect of lowering the resistance between them can be brought about. Such lowering of the resistance is achieved because of the presence of the semiconductor layer having a good activation efficiency of impurities, which directly decreases the resistance of this layer.

A gate electrode is ordinarily formed on the surface of the semiconductor assembly constituting the semiconductor device, but can also be embedded under the surface.

Also, in the first and the second semiconductor layers constituting the channel, the wider-forbidden-band semiconductor layer may be formed nearer the base of the semiconductor, with the narrower-forbidden-band semiconductor layer formed thereon; or the narrower-forbidden-band semiconductor layer can be formed nearer the base, with the wider-forbidden-band semiconductor layer formed thereon.

Usefulness of this invention is explained in detail by an example of a compound semiconductor consisting of GaAs and AlGaAs.

As stated above, it is necessary to enlarge the band gap of AlGaAs to some extent in order to effectively generate carriers at the interface between GaAs and AlGaAs and provide high mobility. Therefore, the composition ratio of Al is usually about 0.3 in general. The thickness of this layer is determined within the range of 3000 Å-2000 Å. In order to generate the fast carriers at the interface, the thickness of the AlGaAs layer of the same composition may be about 100 Å, but the above-mentioned range of thickness (3000 Å-2000 Å) is needed to be operated as a transistor. An AlGaAs crystal having a GaAs or Al composition ratio of 0.25 or less is effective as a source of carrier supply since the impurity level, particularly the donor level of Si, is shallow at a value of 100 meV or less. Moreover, the activation efficiency of an impurity when carrying out ion implantation is 2-10 times as high as that having a GaAs or Al composition ratio of 0.25 or more. Accordingly, when the source and drain areas of the field effect transistor are formed by implanting ions, the presence of the AlGaAs or GaAs layer having an Al composition ratio of 0.25 increases the activation efficiency and so decreases the electrode resistance and also the mutual conductance, so that increased speed of the device is brought about.

Thus, this invention includes at least one layer of a semiconductor material having a narrower forbidden band than that of the barrier layer, such narrower layer constituting the channel, or a semiconductor layer having a high activation efficiency for impurities. The thickness of this layer is preferably selected from the range of 10 Å-2000 Å. It is a matter of course that the determination of thickness depends on designs of semiconductor devices. The following is an explanation as to an example using GaAs-AlGaAs hetero-junctions. This example of the invention, which differs from the conventional method of growing a single AlGaAs layer, is to provide a transistor produced by growing the AlGaAs barrier layer having an Al composition ratio of 0.25 or more to generate and keep carriers, next forming the AlGaAs layer or multi-layer structure containing at least one of GaAs in a composition ratio of 0.25 or less, and then forming the electrode areas by ion implantation etc. The structure between the barrier layer and the gate electrode may be a multi-layer structure in the shape of a quantum well, or a super lattice-structure. Also, the AlGaAs or GaAs layer having a composition ratio of 0.25 or less may be produced by continuously changing the Al composition.

Another characteristic feature of this invention resides in that a depletion type transistor can easily be produced. Namely, since there is an area having an Al composition ratio of 0.25 or less between the channel and the gate electrode, the implantation of ions into this layer can easily control the amount of an impurity, so that a depletion type transistor having a voltage in the desired range can be produced by implanting a smaller amount of ion than in the case of a layer of an Al composition ratio of 0.25 or more. Accordingly, integration can easily be brought about by the employment of this invention.

It is to be noted that it is desirable that the barrier layer be as thin as possible, but an excessively thin layer cannot confine the carriers at the hetero-structure interface. Therefore, the thickness of such layer should be determined in light of the wave function of electrons, to be more than the extent that electrons permeate the AlGaAs layer (more than about 30 Å). On the other hand, it should not be more than 500 Å, because an excessively thick layer is considered to be the same as an element in the conventional method. The more preferable thickness is 300 Å or less.

The above explanation was made using an example of GaAs-AlGaAs hetero-structure, but other compound semiconductor materials can be used in this invention. For example, there are mentioned $Al_yGa_{1-y}As$-$Al_xGa_{1-x}As$, GaAs-AlGaAsP, InP-InGaAsP, InP-InGaAs, InAs-GaAsSb, and so on.

DETAILED DESCRIPTION OF PREFERRED EMBODIMENTS

This invention is illustrated in more detail by the following examples.

Figure 1:
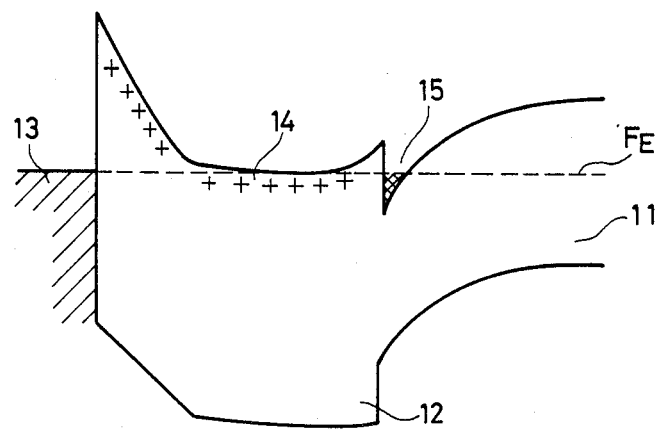
FIGS. 1 and 2 are energy diagrams of the conventional hetero-junction type field effect transistor.
Figure 2:
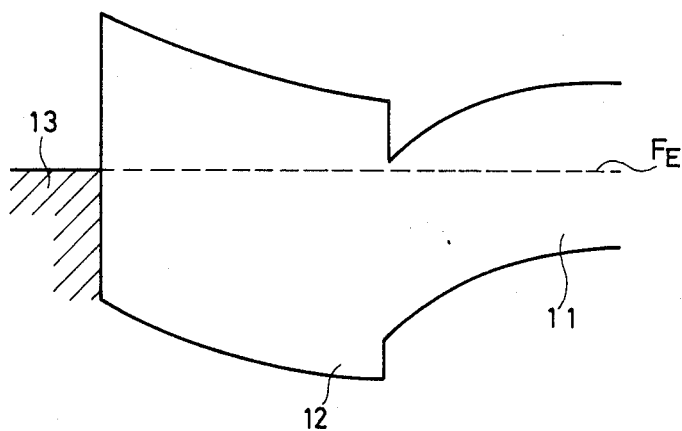
Figure 3A:
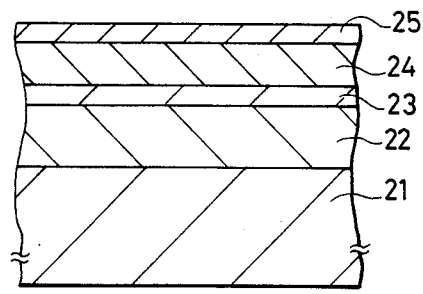
FIG. 3 is a section view showing the process of this invention for producing transistors.
Figure 3B:
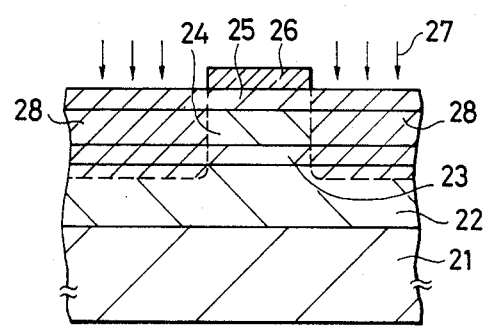
Figure 3C:
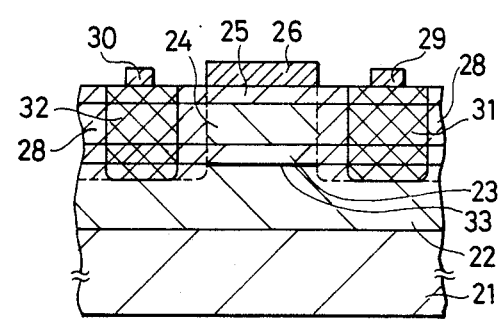

The principal processes are shown in FIGS. 3a–3c.

On the semiconductor GaAs base (21), the GaAs layer (22) was grown about 1 μm thick at a base temperature of 600° C. without intentionally adding any impurity and then the AlGaAs layer (23) including Al and Ga in a composition ratio of about 0.3:0.7 was grown about 100 Å thick by the well-known molecular beam epitaxy. Next, the AlGaAs layer (24) including Al and Ga in a composition ratio of about 0.2:0.8 was grown 500 Å thick, and then the shutter of the Al source was closed to grow a GaAs layer (25) about 100 Å thick (FIG. 3a).

The GaAs layer (22) and the AlGaAs layer (23) are the first and second semiconductor layers constituting the channel, as mentioned above. The channel is formed on the GaAs layer (22) side, intentionally including no impurity. The AlGaAs layer (24) is a semiconductor layer of this invention. The Al composition ratio of the AlGaAs layer (24) is smaller than that of the AlGaAs layer (23), so that the layer (24) has the smaller band gap. The GaAs layer (25) is deposited for preventing oxidation of the AlGaAs layer. The electrical contact with electrodes prepared on the above layer becomes better.

On the epitaxial layer was formed a metal to be a gate electrode 26, for example Ti;W, about 2 μm thick. Using this metal electrode as a mask for implanting ions, $2 \times 10^{13}$ cm$^{-3}$ of (self-aligned) Si ions 27 were implanted at 70 KeV. Lattice defects caused by the ion implantation was removed, and annealing was carried out at 800° C. for 30 minutes to activate the ions. This impurity area is shown as 28 in FIG. 3b.

It is to be noted that the other usable donor impurities for the present invention, other than Si, include Ge, Sn, Te, Se and S. Approximately $10^{13}$–$10^{14}$ cm$^{-3}$ of impurity ions are implanted. The impurity concentration is determined according to the amount of carriers to be generated or the characteristic features required for the device. Energy for implanting ions, depending on the ions to be implanted, ranges from 50 to 200 KeV.

Next, source area (31) and drain area (32) were formed by an ordinary alloying in connection with the ion implanted area, and, further, metal Al electrodes (29, 30) were formed to produce a field effect transistor (FIG. 3c). It is to be noted that 33 shows the carriers generated at the interface.

It is to be noted that the source and drain areas are formed by laminating, for example, Au-Ge alloy (2000 Å)–Ni (100 Å)–Au-Ge alloy (3000 Å) on the fixed portion and heating the resulting layers in H$_2$ at 400° C. for 5 minutes.

In the thus produced field effect transistor, the carrier concentration in the source and drain areas was at least twice as much as that of the conventional single layer having an Al composition ratio of 0.3, and the electrode resistance was lowered to one-half, so that utility of this invention was proved.

Figure 10:
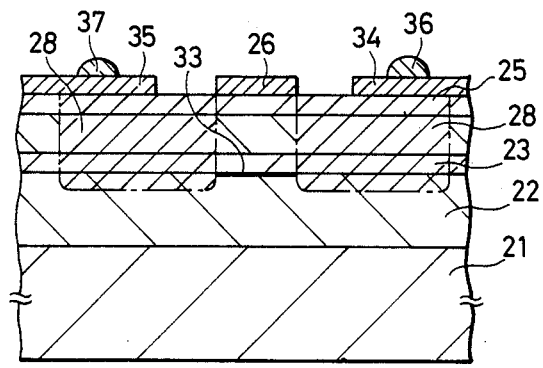

It is to be noted that FIG. 10 shows an example of forming the source and drain electrodes without alloying. The fundamental structure is the same as given in FIG. 3. The epitaxial GaAs layer containing $2 \times 10^{18}$ cm$^{-3}$ of a high-concentration impurity was grown on the layer 25 and processed to obtain the fixed shape (34, 35). And metal to be used for bonding (36, 37) was placed on this layer (34, 35). This is an example of a non-alloy type electrode.

Figure 4:
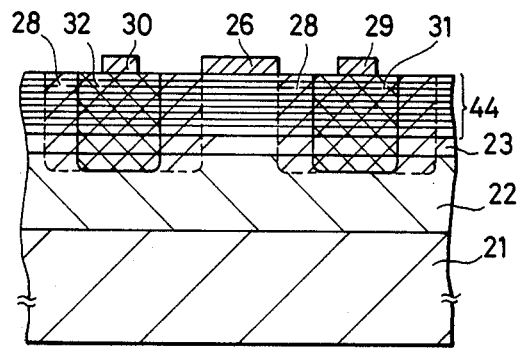
FIG. 4, FIG. 5a, and FIGS. 6–10 are section views showing the structure of the transistor of this invention.
Figure 5A:
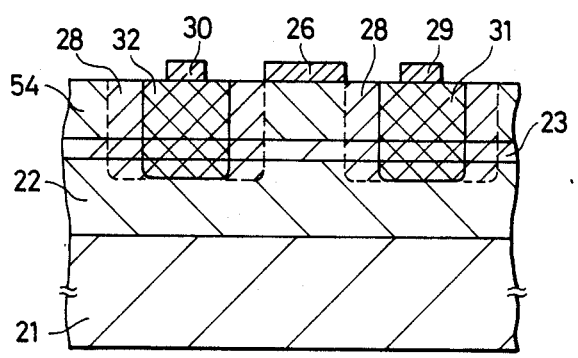
Figure 5B:
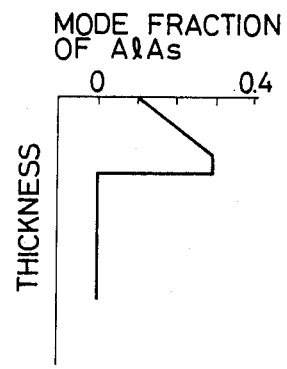
FIG. 5b is a graph showing the distribution of the AlAs.

FIG. 4 and FIG. 5 show other device examples, produced in a manner similar to the previously discussed embodiment of this invention. FIG. 4 shows an example having a multi-layer (super lattice) structure where each of ten Al$_x$Ga$_{1-x}$As (x=0.3) layers and each of ten GaAs layers are laminated in each thickness of 50 Å one after the other in the area 44. FIG. 5a shows an example of continuously decreasing the Al ratio to 0.1 after the formation of the barrier layer. It is to be noted that FIGS. 4 and 5a have the same definition as in FIG. 3 as to corresponding parts. FIG. 5b shows the change of ratio of Al in the area corresponding to that in FIG. 5a. In any case, it was observed that the obtained effect was about the same as in the previously discussed examples.

It is to be noted that in the examples of this invention, an impurity was not doped in any layers produced by molecular beam epitaxy, but when an impurity was doped up to a concentration of $10^{16}$ cm$^{-3}$, there was observed no essential change. This proved that the effect of this invention could be sufficiently kept.

In the examples of this invention, the structure wherein the channel was formed by growing the GaAs layer on a GaAs base and preparing the barrier layer on the GaAs layer was examined, but the order of the laminated layers need not always be the same as above, and can be changed variously as shown in FIGS. 6–9.

The reference characters in FIGS. 6–9 that are the same as given in the preceding figures represent the same structure.

Figure 6:
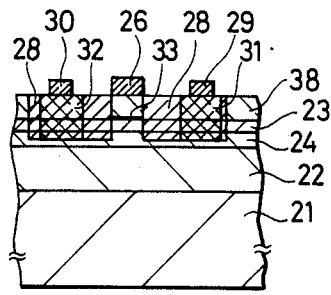

FIG. 6 shows that the GaAs layer (22), the Al$_{0.2}$Ga$_{0.8}$As layer (24), the Al$_{0.3}$Ga$_{0.7}$As layer (23) and the GaAs layer (38) were grown on the semiconductor GaAs base (21) in this order by molecular beam epitaxy, each of which was grown without intentionally adding any impurities. Next, the gate electrode (26) was formed in a manner similar to the above-mentioned examples, and then the insular impurity area (28) was formed by implanting ions using the gate electrode as a mask. The source and drain electrodes (31, 32) were formed by ordinary alloying to produce a semiconductor device. In this example, the barrier layer is the layer (23), and the channel is formed at the interface between the GaAs layer (38) and said barrier layer (23). 33 shows the carriers generated. The layer (24), having the high activation efficiency of impurities, brought about the generation of the desired amount of carriers near the channel and could substantially lower the resistance of the source and drain electrodes.

Figure 7:
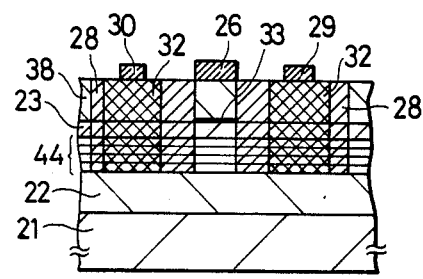

The example of FIG. 7 has a structure similar to that of FIG. 6, except that the semiconductor layer (24) consists of the super lattice layer of a multi-quantum well. The super-lattice layer itself is the same as explained in connection with FIG. 4. It is to be noted that in this example, also, the semiconductor layer (23) is the barrier layer and the channel is formed at the interface between the GaAs layer (38) and said barrier layer.

Figure 8:
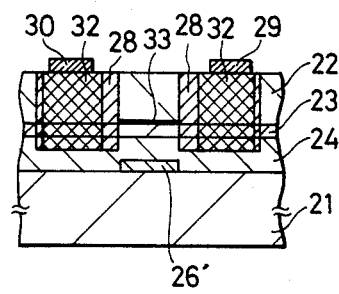

FIG. 8 shows an example wherein the gate electrode (26') is embedded. The GaAs layer containing the highly concentrated impurity was formed on the semiconductor GaAs base (21) in a thickness of 2000 Å by molecular beam epitaxy and etched to be the width of the gate electrode. Then the $Al_{0.2}Ga_{0.8}As$ layer (24) 300 Å thick, the $Al_{0.3}Ga_{0.7}As$ layer (23) 100 Å and the last GaAs layer (22) 500 Å were grown thereon.

Figure 9:
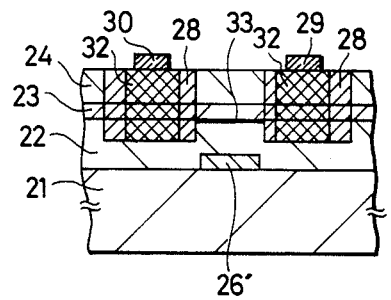

FIG. 9 shows an example of an embedded gate electrode (26'). This example differs from that of FIG. 8 in that the laminated barrier layer (23) and the narrow forbidden band semiconductor layer (22) are reversed, and the barrier layer is placed on the surface side of the semiconductor assembly.

The carrier concentration in the source and drain areas according to this invention increased 2-10 times as much as that of the source and drain areas produced by the conventional method, and the electrode resistance decreased to one-half-one-tenth.

What is claimed is:

1. A semiconductor device comprising at least first and second semiconductor layers, the first and second semiconductor layers being disposed so as to form a hetero-junction therebetween, the hetero-junction having a channel adjacent thereto on the second semiconductor layer side, the channel having opposite edges; source and drain areas located each at a respective one of the opposite edges of the channel, the source and drain areas extending so as to have portions of the first and second semiconductor layers extending between the source and drain areas; and gate electrode means for controlling transmitting of carriers in the channel; characterized in that both the first and second semiconductor layers, between said source and drain areas, have a portion containing only $10^{16}$ cm$^{-3}$ or less of an impurity; said portion containing only $10^{16}$ cm$^{-3}$ or less of an impurity has relatively high impurity concentration regions adjacent opposite sides thereof, such relatively high impurity concentration regions having impurity concentrations ranging from $5\times 10^{17}$ to $5\times 10^{19}$ cm$^{-3}$; said first semiconductor layer has a wider forbidden bandgap than that of said second semiconductor layer; and at least one further semiconductor layer is provided adjacent a surface of the first semiconductor layer opposite to the surface of the first semiconductor layer forming the hetero-junction with said second semiconductor layer, said at least one further semiconductor layer having a higher activation efficiency for the impurities of the relatively high impurity concentration regions than that of said first semiconductor layer.

2. A semiconductor device as claimed in claim 1, characterized in that the distance between said at least one further semiconductor layer and the hetero-junction formed by the first and the second semiconductor layers is not over 500 Å.

3. A semiconductor device as claimed in claim 1, characterized in that said at least one further semiconductor layer comprises a multi-quantum well prepared by laminating a comparatively wider forbidden band semiconductor layer and a comparatively narrower forbidden band semiconductor layer one after the other.

4. A semiconductor device as claimed in claim 3, characterized in that the thickness of each layer of said multi-quantum well structure is selected from the range from 10 to 100 Å.

5. A semiconductor device as claimed in claim 1, characterized in that said at least one further semiconductor layer is formed between said gate electrode means and the hetero-junction formed by the first and the second semiconductor layers.

6. A semiconductor device as claimed in claim 3, characterized in that said multi-quantum well structure is formed between said gate electrode means and the hetero-junction formed by the first and the second semiconductor layers.

7. A semiconductor device as claimed in claim 1, wherein the source and drain areas are formed in the relatively high impurity concentration regions.

8. A semiconductor device as claimed in claim 2, wherein the distance between the at least one further semiconductor layer and the hetero-junction is not over 300 Å.

9. A semiconductor device as claimed in claim 1, wherein the respective source and drain areas are spaced from the respective opposite sides of the area containing only $10^{16}$ cm$^{-3}$ of an impurity, and the relatively high impurity concentration regions bridge the space between the respective opposite sides of the area containing only $10^{16}$ cm$^{-3}$ of an impurity and the respective source and drain areas.

10. A semiconductor device as claimed in claim 1, wherein the impurities for forming the relatively high impurity concentration regions are selected from the group consisting of Si, Ge, Sn, Te, Se and S.

11. A semiconductor device as claimed in claim 1, wherein the gate electrode means is located over the area containing only $10^{16}$ cm$^{-3}$ or less of an impurity.

12. A semiconductor device as claimed in claim 1, wherein the gate electrode means is beneath the area containing only $10^{16}$ cm$^{-3}$ or less of an impurity, said gate electrode means being beneath the first and second semiconductor layers and said at least one further semiconductor layer.

13. A semiconductor device as claimed in claim 1, wherein the at least one further semiconductor layer is a layer grown without intentionally adding any impurities.

14. A semiconductor device comprising at least first and second semiconductor layers respectively formed of AlGaAs and GaAs, the first and second semiconductor layers being disposed so as to form a hetero-junction therebetween, the hetero-junction having a channel adjacent thereto on the second semiconductor layer side, the channel having opposite edges; source and drain areas located each at a respective one of the opposite edges of the channel, the source and drain areas extending so as to have portions of the first and second semiconductor layers extending between the source and drain areas; and gate electrode means for controlling transmitting of carriers in the channel; characterized in that both the first and second semiconductor layers, between said source and drain areas, have a portion containing only $10^{16}$ cm$^{-3}$ or less of an impurity; said portion containing only $10^{16}$ cm$^{-3}$ or less of an impurity has relatively high impurity concentration regions adjacent opposite sides thereof, such relatively high impurity concentration regions having impurity concentrations ranging from $5\times 10^{17}$ to $5\times 10^{19}$ cm$^{-3}$; said first semiconductor layer has a wider forbidden bandgap than that of the second semiconductor layer; and at least one further semiconductor layer, of AlGaAs having a composition ratio of Al to Ga of 0.25 or less, is provided adjacent a surface of the first semiconductor layer opposite to the surface of the first semiconductor layer forming the hetero-junction with the second semiconductor layer, the composition ratio of Al to Ga of the first semiconductor layer being more than 0.25.

15. A semiconductor device as claimed in claim 14, wherein said first semiconductor layer, of AlGaAs, has a composition ratio of Al to Ga of around 0.3.

* * * * *